(12) United States Patent
Qin et al.

(10) Patent No.: US 8,069,909 B2
(45) Date of Patent: Dec. 6, 2011

(54) HEAT DISSIPATION DEVICE

(75) Inventors: Ji-Yun Qin, Shenzhen (CN); Zhi-Yong Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 431 days.

(21) Appl. No.: 12/399,028

(22) Filed: Mar. 6, 2009

(65) Prior Publication Data

US 2009/0321054 A1 Dec. 31, 2009

(30) Foreign Application Priority Data

Jun. 27, 2008 (CN) .......................... 2008 1 0068071

(51) Int. Cl.
*F28D 15/00* (2006.01)
(52) U.S. Cl. .................. 165/104.33; 165/80.3; 165/185; 361/700
(58) Field of Classification Search .................. 165/185, 165/104.33, 704, 700, 80.3; 257/715; 174/15.2; 361/700, 704

See application file for complete search history.

(56) References Cited

U.S. PATENT DOCUMENTS

| 5,950,444 | A | * | 9/1999 | Matsunaga | .................. 62/259.2 |
| 6,111,751 | A | * | 8/2000 | Sakuyama | ..................... 361/704 |
| 6,148,906 | A | * | 11/2000 | Li et al. | ..................... 165/104.33 |
| 7,262,965 | B2 | * | 8/2007 | Cheng | ............................ 361/697 |
| 7,408,781 | B1 | * | 8/2008 | Chen | ............................. 361/715 |
| 7,746,640 | B2 | * | 6/2010 | Cao et al. | ........................ 361/700 |
| 2008/0142193 | A1 | * | 6/2008 | Li et al. | ......................... 165/80.3 |
| 2008/0310122 | A1 | * | 12/2008 | Chou et al. | ........................ 361/720 |
| 2009/0000768 | A1 | * | 1/2009 | Zheng et al. | .................. 165/80.3 |
| 2009/0166007 | A1 | * | 7/2009 | Li et al. | ..................... 165/104.33 |

* cited by examiner

*Primary Examiner* — Judy Swann
*Assistant Examiner* — Devon Russell
(74) *Attorney, Agent, or Firm* — Altis Law Group, Inc.

(57) ABSTRACT

A heat dissipation device includes a first heat sink thermally contacting an electronic component, a second heat sink connecting to the first heat sink, and a heat pipe thermally connecting the first heat sink with the second heat sink. The first heat sink has a first base which defines a cutout at a lateral side thereof. The second heat sink has a second base. The heat pipe includes an evaporating portion disposed on the base, a condensing portion disposed on the second base and a connecting portion interconnecting the evaporating portion with the condensing portion. An insert portion protrudes from the second base and is engagingly inserted into the cutout. The connecting portion of the heat pipe extends through the insert portion.

16 Claims, 3 Drawing Sheets

US 8,069,909 B2

HEAT DISSIPATION DEVICE

BACKGROUND OF THE INVENTION

1. Field of the Invention

The present disclosure relates to heat dissipation and, more particularly, to a heat dissipation device incorporating heat pipes.

2. Description of Related Art

Electronic components, such as central processing units (CPUs) comprise numerous circuits operating at high speeds and generating substantial heat. Under most circumstances, it is necessary to cool the CPUs to maintain safe operating conditions and assure that the CPUs function properly and reliably. In the past, various approaches have been used to cool electronic components. Typically, a finned metal heat sink is attached to an outer surface of the CPU to remove the heat therefrom. The heat absorbed by the heat sink is then dissipated to ambient air. The heat sink is made of highly heat-conductive metal, such as copper or aluminum, and generally comprises a base contacting the CPU to absorb heat therefrom and a plurality of fins formed on the first base for dissipating the heat. However, as the operating speed of electronic components increases markedly in the current environment, heat dissipation using only metal conduction may be insufficient for the amount of heat generated. Heat of the bottom of the metal heat sink cannot be transferred to the whole device quickly enough, and especially not to the fins separate from the bottom of the metal heat sink.

Heat pipes, which operate by phase change of working liquid sealed therein, have been widely used due to their excellent heat transfer properties. Accordingly, heat dissipation devices equipped with heat pipes appear in many current applications and are widely used, with optimal performance thereof a common goal in current R & D efforts.

What is needed, therefore, is a heat dissipation device incorporating heat pipes with enhanced heat dissipation performance.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
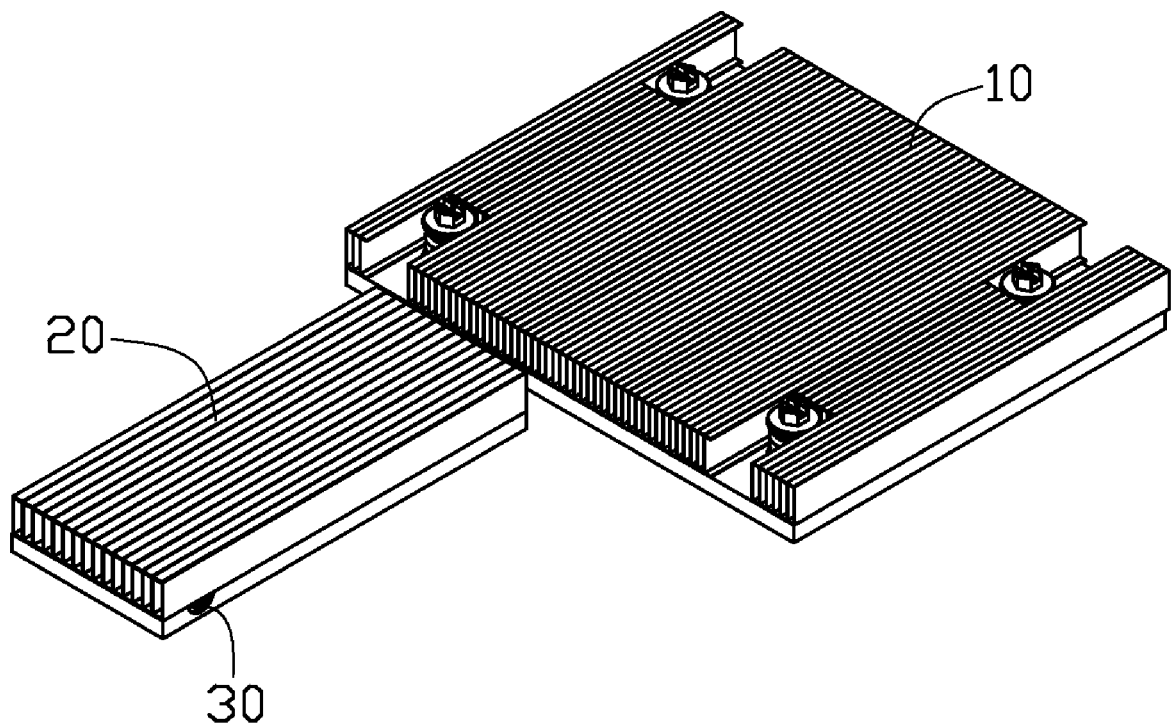
FIG. 1 is an assembled, isometric view of a heat dissipation device in accordance with an embodiment of the disclosure.
Figure 2:
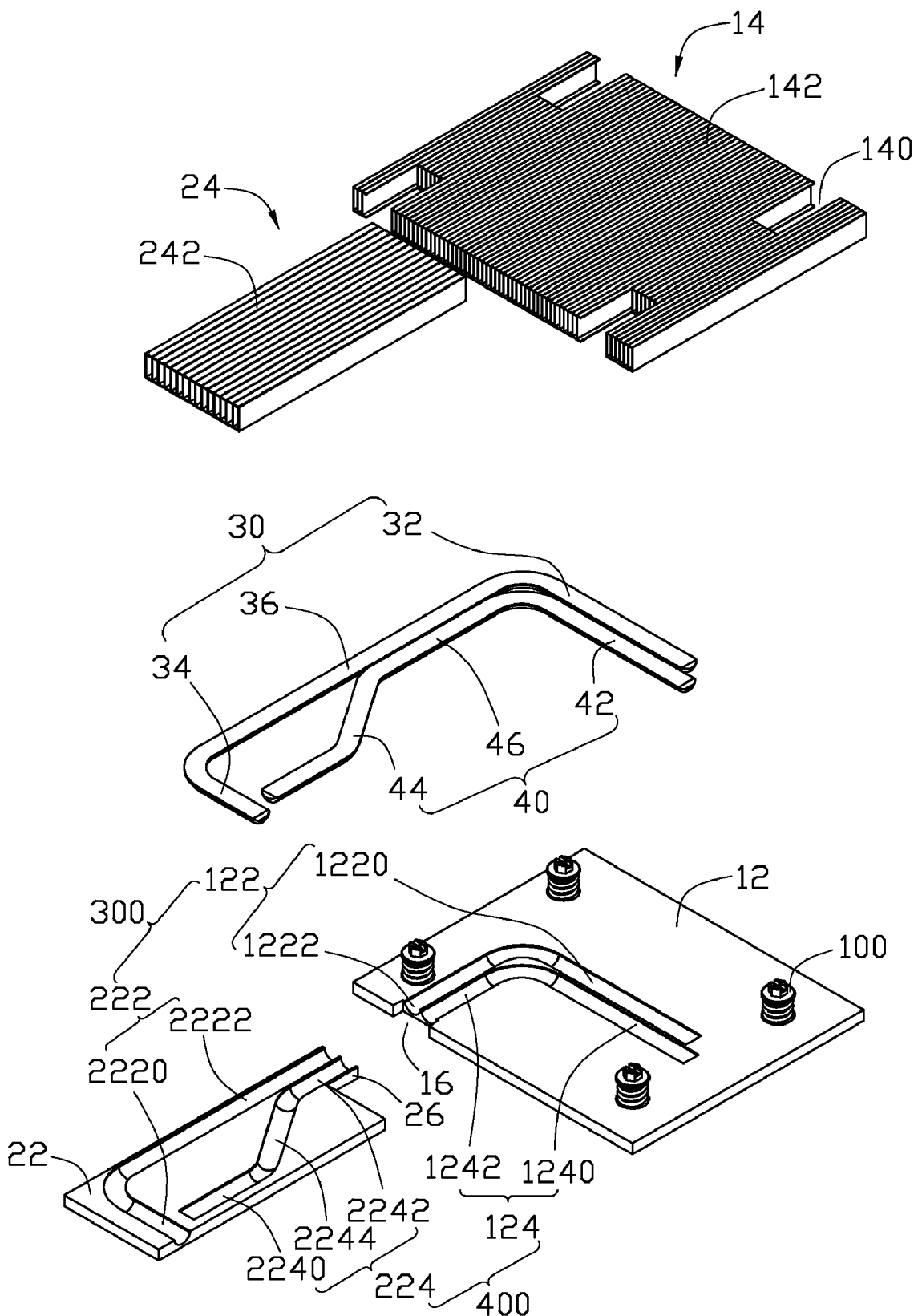
FIG. 2 is an exploded view of the heat dissipation device of FIG. 1.

Referring to FIGS. 1-2, a heat dissipation device in accordance with an embodiment of the disclosure dissipates heat generated by an electronic component (not shown) mounted on a printed circuit board (not shown). The heat dissipation device comprises a first heat sink 10 thermally contacting the electronic component, a second heat sink 20 located adjacent thereto, and a first heat pipe 30 and a second heat pipe 40 thermally connecting the first heat sink 10 with the second heat sink 20.

The first heat sink 10 is made of a metal with good heat conductivity, such as aluminum, copper, or an alloy thereof. The first heat sink 10 comprises a rectangular first base 12 and a first fin set 14 fixed to a top surface of the first base 12. The first fin set 14 comprises a plurality of parallel first fins 142, each of which consists of an upright sheet body (not labeled) and a pair of flanges (not labeled) bent horizontally from a top and a bottom of the sheet body engaging the sheet body of an adjacent first fin 142. The first fin set 14 is secured on the top face of the first base 12 by lower flanges of the first fins 142 soldered to the first base 12. Every two adjacent first fins 142 form a passage (not labeled) therebetween allowing airflow therethrough. Four fasteners 100 engage the first base 12 securing the first heat sink 10 to the printed circuit board where the electronic component is mounted. The first fin set 14 occupies the whole top face of the first base 12 except where the fasteners 100 are located. Two spaced slots 140 are defined at each of two opposite lateral sides of the first fin set 14 corresponding to the fasteners 100, correspondingly accommodating top portions of the four fasteners 100. A rectangular cutout 16 is defined at a lateral side of the first base 12. An L-shaped first receiving groove 122 is defined on the top surface of the first base 12. An L-shaped second receiving groove 124 is defined on the top surface of the first base 12. The first and second receiving grooves 122, 124 are arranged closely side-by-side. The first receiving groove 122 has a first straight section 1220 located at a center of the first base 12 and a first connecting section 1222 perpendicular to the first straight section 1220. The second receiving groove 124 has a second straight section 1240 juxtaposed with the first straight section 1220 and a second connecting section 1242 juxtaposed with the first connecting section 1222. The first and second connecting sections 1222, 1242 extend to and communicate with the cutout 16.

Figure 3:
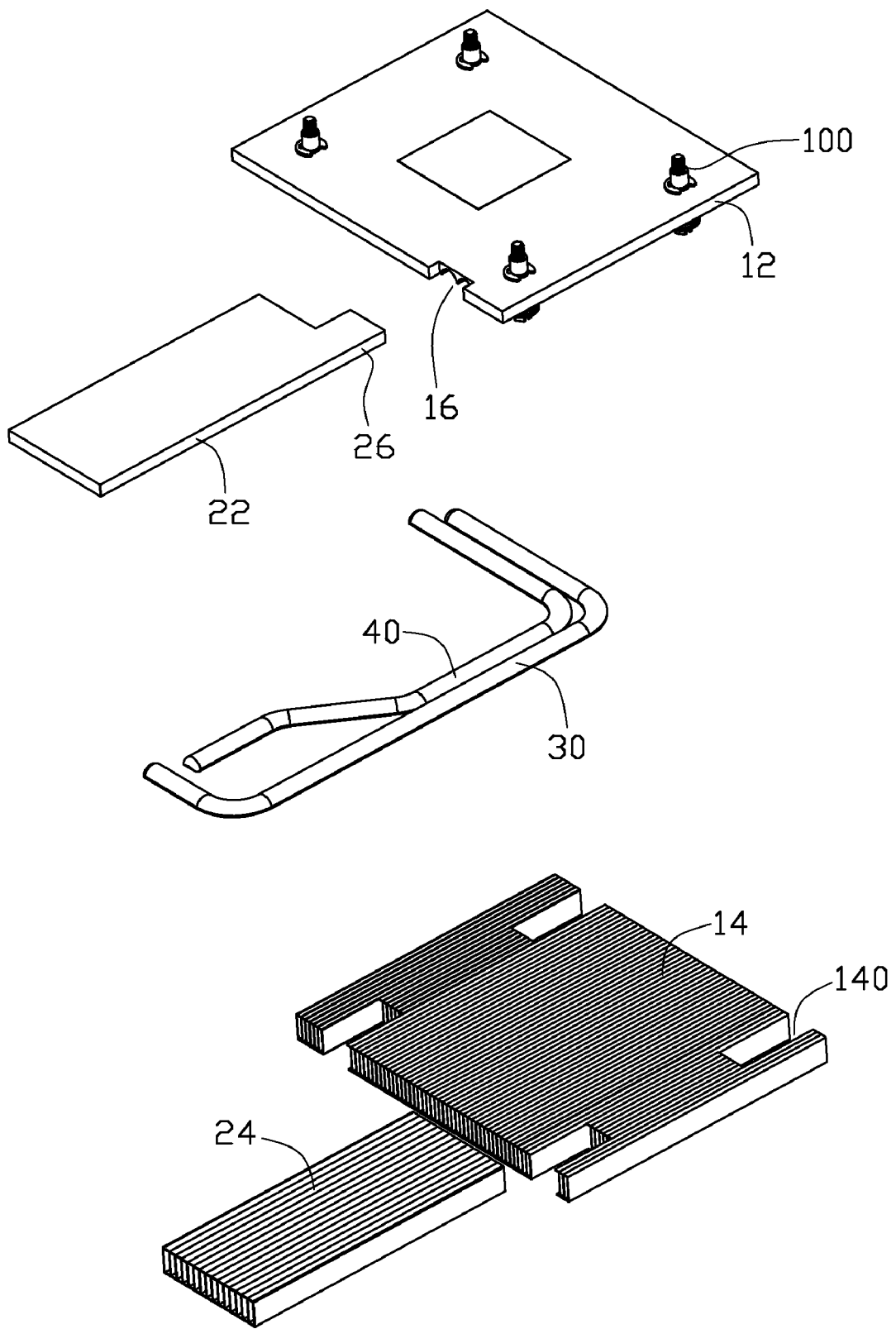
FIG. 3 is an inverted, exploded view of the heat dissipation device of FIG. 1.

Referring to FIG. 3 also, the second heat sink 20 is made of a metal with good heat conductivity, such as aluminum, copper, or an alloy thereof. The second heat sink 20 comprises a rectangular second base 22 and a second fin set 24 fixed to a top surface of the second base 22. The second fin set 24 comprises a plurality of parallel second fins 242, each of which consists of an upright sheet body (not labeled) and a pair of flanges (not labeled) bent horizontally from a top and a bottom of the sheet body engaging an adjacent second fin 242. The second fin set 24 is secured on the whole top face of the second base 22, by soldering lower flanges of the second fins 242 on the second base 22. A side of the second base 22 is smaller than that of the first base 12. A rectangular insert portion 26 perpendicularly protrudes from a corner of the second base 22 and towards the first heat sink 10. The insert portion 26 and the second base 20 are integrally made from one piece metal block. The insert portion 26 has a bottom surface and top surface correspondingly coplanar with a bottom surface and top surface of the second base 22. A front portion of the insert portion 26 has a configuration complementing that of the cutout 16 of the first base 12. An L-shaped third receiving groove 222 is defined on the top surface of the second base 22. The third receiving groove 222 has a third straight section 2220 extending along a lateral side of the second base 22 opposite to the insert portion 26 and a third connecting section 2222 perpendicular to the third straight section 2220. A bent fourth receiving groove 224 is defined on the top surface of the second base 22. The fourth receiving groove 224 has a fourth connecting section 2242 close to and side-by-side with the third connecting section 2222, a fourth straight section 2240 separated from and parallel to the third connecting section 2222, and an inclined section 2244 interconnecting the fourth straight section 2240 with the fourth connecting section 2242. The third and fourth connecting sections 2222, 2242 extend through a top surface of the insert portion 26 along a length of the insert portion 26.

The first heat pipe 30 is approximately U-shaped and comprises a first evaporating portion 32, a first condensing portion 34 parallel to the first evaporating portion 32 and a first connecting portion 36 perpendicularly interconnecting the first evaporating section 32 with the first condensing portion 34.

The second heat pipe 40 comprises a second evaporating portion 42, a bent second condensing portion 44 and a second connecting portion 46 interconnecting the second evaporating section 42 with the second condensing portion 44. The second connecting portion 46 is perpendicular to the second evaporating portion 42. The second condensing portion 44 angles from the second connecting portion 46.

In assembly of the heat dissipation device, the insert portion 26 of the second base 22 is snugly inserted into the cutout 16 of the first base 12. The first connecting section 1222 of the first receiving groove 122 correspondingly communicates with the third connecting section 2222 of the third receiving groove 222, whereby the first receiving groove 122 cooperates with the third receiving groove 222 to form a continuous first groove 300. The first heat pipe 30 is configured identically to first groove 300, being snugly received therein. The first evaporating portion 32 is received in the first straight section 1220, the first condensing portion 34 is received in the third straight section 2220, and the first connecting portion 36 is simultaneously received in the first and third connecting sections 1222, 2222. The second connecting section 1242 of the second receiving groove 124 correspondingly communicates with the fourth connecting section 2242 of the fourth receiving groove 224, whereby the second receiving groove 124 cooperates with the fourth receiving groove 224 to form a continuous second groove 400. The second heat pipe 40 is configured identically to second groove 400 and is snugly received therein. The second evaporating portion 42 is received in the second straight section 1240, the second condensing portion 44 is simultaneously received in the fourth straight section 2240 and the inclined section 2244, and the second connecting portion 46 is simultaneously received in the second and fourth connecting sections 1242, 2242. Top surfaces of the first and second heat pipes 30, 40 are coplanar with the top surfaces of the first and second base 12, 22. The first and second heat pipes 30, 40 are sandwiched between the first fin set 14 and the first base 12, meanwhile, between the second fin set 24 and the second base 22.

In use, according to the embodiment of the disclosure, the first and second heat pipes 30, 40 connect the first heat sink 10 with the second heat sink 20. Heat generated by the electronic component is absorbed by the heat sink 10 and effectively transferred to the second heat sink 20 via the first and second heat pipes 30, 40. The heat is dispersed into ambient air via the first fin set 14 and the second fin set 24, allowing the disclosed heat dissipation device to improve heat dissipation efficiency, thereby preventing the electronic component from overheating. Additionally, the first and second heat pipes 30, 40 extend through the insert portion 26 of the second heat sink 20 which is securely inserted into the cutout 16 of the first heat sink 10, whereby the first and second heat pipes 30, 40 can be reliably secured in position even when the heat dissipation device is subject to vibration and protected from damage at a junction of the first heat sink 10 and the second heat sink 20 by support of the insert portion 26 of the second heat sink 20.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary or exemplary embodiments of the disclosure.

What is claimed is:

1. A heat dissipation device comprising:
   a first heat sink comprising a first base defining a cutout at a lateral side thereof;
   a second heat sink comprising a second base and an insert portion protruding from a lateral side of the second base and inserted into the cutout of the first base of the heat sink;
   a first heat pipe connecting the first heat sink with the second heat sink, the first heat pipe comprising a first evaporating portion disposed on the first base, a first condensing portion disposed on the second base and a first connecting portion interconnecting the first evaporating portion with the first condensing portion, the first connecting portion of the first heat pipe extending through the insert portion; and
   two fin sets each comprising a plurality of fins respectively disposed on the first base and second base;
   wherein a first receiving groove is defined on a top surface of the first base and communicates with the cutout, a third receiving groove is defined on a top surface of the second base and extends through the insert portion.

2. The heat dissipation device as claimed in claim 1, wherein the insert portion of the second heat sink has a configuration in complement with that of the cutout of the first base.

3. The heat dissipation device as claimed in claim 2, wherein a top surface of the first base is coplanar and continuous with top surfaces of the second base and the insert portion.

4. The heat dissipation device as claimed in claim 1, wherein the first receiving groove communicates with the third receiving groove, the first and third receiving grooves cooperatively forming a continuous first groove.

5. The heat dissipation device as claimed in claim 4, wherein the first heat pipe is configured identically to the first groove and is snugly received therein.

6. The heat dissipation device as claimed in claim 1, wherein a second receiving groove is defined on the top surface of the first base and abuts the first receiving groove side-by-side.

7. The heat dissipation device as claimed in claim 6, wherein a fourth receiving groove is defined on the top surface of the second base and spaced from the third receiving groove.

8. The heat dissipation device as claimed in claim 7, wherein the second receiving groove communicates with the fourth receiving groove, the second and fourth receiving grooves cooperatively form a continuous second groove.

9. The heat dissipation device as claimed in claim 8, further comprising a second heat pipe configured identically to the second groove and snugly received in the second groove, the second heat pipe extending through the insertion portion.

10. A heat dissipation device comprising:
    a first heat sink comprising a first base defining a cutout at a lateral side thereof, a first receiving groove defined on a top surface of the first base and comprising a first straight section located at a center of the first base and a first connecting section communicating with the cutout;
    a second heat sink comprising a second base and an insert portion protruding therefrom and inserted into the cutout, a third receiving groove defined on a top surface of the second base, the third receiving groove comprising a third straight section located remote from the insert portion and a third connecting section extending through the insert portion, the first receiving groove communicating with the third receiving groove to cooperatively form a continuous first groove; and a first heat pipe received in the first groove.

11. The heat dissipation device as claimed in claim 10, wherein the first heat pipe comprises a first evaporating portion received in the first straight section, a first condensing portion received in the third straight section, and a first connecting portion simultaneously received in the first and third connecting sections.

12. The heat dissipation device as claimed in claim 11, wherein the first receiving groove of the first base of the heat sink and the third receiving groove of the second heat sink each are L-shaped.

13. The heat dissipation device as claimed in claim 10, wherein an L-shaped second receiving groove is defined on the top surface of the first base side-by-side with the first receiving groove, and the second receiving groove comprises a second straight section juxtaposed to the first straight section and a second connecting section juxtaposed to the first connecting section and communicating with the cutout.

14. The heat dissipation device as claimed in claim 13, wherein a bent fourth receiving groove is defined on the top surface of the second base, the fourth receiving groove has a fourth connecting section close to the third connecting section and extending through the insert portion, a fourth straight section spacing from the third connecting section, and an inclined section interconnecting the fourth straight section with the fourth connecting section.

15. The heat dissipation device as claimed in claim 14, wherein the second receiving groove communicates with the fourth receiving groove to cooperatively form a continuous second groove.

16. The heat dissipation device as claimed in claim 15 further comprising a second heat pipe received in the second groove, wherein the second heat pipe comprises a second evaporating portion received in the second straight section, a second condensing portion simultaneously received in the fourth straight section and the inclined section, and a second connecting portion interconnecting the second evaporating portion and the second condensing portion, the second connecting portion being simultaneously received in the second and fourth connecting sections.

* * * * *